United States Patent
Hodes

(10) Patent No.: US 9,061,917 B2
(45) Date of Patent: Jun. 23, 2015

(54) COMBINATORIAL SYNTHESIS OF THE DIAMOND UNIT CELL

(71) Applicant: Daniel Hodes, Great Falls, VA (US)

(72) Inventor: Daniel Hodes, Great Falls, VA (US)

(73) Assignee: Unit Cell Diamond LLC, Bethesda, MD (US)

( * ) Notice: Subject to any disclaimer, the term of this patent is extended or adjusted under 35 U.S.C. 154(b) by 0 days.

(21) Appl. No.: 14/120,508

(22) Filed: May 28, 2014

(65) Prior Publication Data

US 2014/0286851 A1 Sep. 25, 2014

Related U.S. Application Data

(63) Continuation-in-part of application No. 13/204,218, filed on Aug. 5, 2011, now Pat. No. 8,778,295.

(60) Provisional application No. 61/344,510, filed on Aug. 11, 2010.

(51) Int. Cl.
  *C01B 31/06* (2006.01)
  *B01J 19/12* (2006.01)
  *B01J 3/06* (2006.01)
  *B01J 3/08* (2006.01)

(52) U.S. Cl.
  CPC ............... *C01B 31/06* (2013.01); *B01J 19/126* (2013.01); *B01J 2203/0655* (2013.01)

(58) Field of Classification Search
  None
  See application file for complete search history.

(56) References Cited

U.S. PATENT DOCUMENTS

| | | | |
|---|---|---|---|
| 3,630,768 A | 12/1971 | Bianchi | |
| 4,434,188 A | 2/1984 | Kanno | |
| 5,051,785 A | 9/1991 | Beetz | |
| 5,180,571 A * | 1/1993 | Hosoya et al. | 423/446 |
| 5,201,986 A | 4/1993 | Ota | |
| 5,217,700 A | 6/1993 | Kurihare | |
| 5,470,661 A | 11/1995 | Bailey | |
| 5,547,716 A | 8/1996 | Thaler | |
| 5,569,501 A | 10/1996 | Bailey | |
| 5,849,079 A | 12/1998 | Gruen | |
| 6,060,118 A | 5/2000 | Ishikura | |
| 6,342,195 B1 | 1/2002 | Roy | |
| 6,858,080 B2 | 2/2005 | Linares | |
| 7,306,778 B2 | 12/2007 | Chaffin | |
| 7,368,013 B2 | 5/2008 | Sung | |
| 7,833,505 B2 | 11/2010 | Donnet | |
| 8,171,568 B2 | 5/2012 | Freitas | |
| 8,276,211 B1 | 9/2012 | Freitas | |

OTHER PUBLICATIONS

Maier, et al., "Tert-Butyl-Substituierte Cyclobutadiene Und Cyclopentadienone" Tetrahedron Letters No. 11, pp. 1025-1030, 1972.
Maier, et al., "Tetrakis(trimethylsilyl)tetrahedrane" J. Am. Chem. Soc. 2002 124, pp. 13819-13826.
Maier, et al., "Tetra-tert-butyltetrahedrane" Angew. Chem. Int. E. Engl. 17 (1978) No. 7.
Maier, et al., "Tetrakis(trimethylsilyl)cyclobutadiene and Tetrakis (trimethylsilyl)tetrahedrane" Angew. Chem. Int. Ed. 2001 40, No. 9.
Eaton and Cole, "Cubane" J.Am.Chem. Soc. 86, 962-963 (1964).
Eaton and Cole, "Cubane" J. Am. Chem. Soc. 86, 3157-3158 (1964).

* cited by examiner

*Primary Examiner* — Guinever Gregorio
(74) *Attorney, Agent, or Firm* — William E. Beaumont

(57) ABSTRACT

A combinatorial synthesis of the diamond unit cell is disclosed wherein a carbon atom free of meta-stable radical impurities reacts with cyclic hydrocarbon compounds or heterocyclic compounds whose structure is tetrahedral or nearly tetrahedral. Reactions conducted in the vapor phase and in the solid state are disclosed.

17 Claims, No Drawings

COMBINATORIAL SYNTHESIS OF THE DIAMOND UNIT CELL

This application is a continuation in part of U.S. application Ser. No. 13/204,218, filed Aug. 5, 2011, which claims benefit of U.S. Provisional Application No. 61/344,510 filed Aug. 11, 2010, all herein incorporated by reference).

BACKGROUND OF THE INVENTION

Diamond is a valuable material due its properties of hardness (10 on the Mohs hardness scale), heat stability, high room temperature thermal conductivity (about 2000 W/mK), very low rms vibration at room temperature (0.002 nm), a high index of refraction (2.4), optical transparency from infrared through visible, and UV fluorescence. Because of its high band gap (5.45 ev) it is a superb electrical insulator ($10^{16}$ ohm). Boron doped (blue) diamond has been found to be p-type semiconductor having a high hole mobility and electrical breakdown strength. Such properties may afford diamond utility with respect to substrates for microelectronic devices, ultraviolet light protective coatings, high energy laser device windows, and even diamond semiconductor devices. Such applications require that diamond be ultra-pure.

Many synthetic methods for diamond are known. These methods produce diamond either from elemental carbon or from elemental carbon obtained from a compound or compounds of carbon which methods subject elemental carbon to conditions under which the carbon will form the crystalline species known as diamond. Typically, these methods involve high pressure, high temperatures, or high energy discharges. Moreover, post treatments are frequently necessary for purification. Most of these methods do not produce ultra-pure diamond, however.

SUMMARY OF THE INVENTION

"Combinatorial Synthesis of Diamond" (Hodes, U.S. application Ser. No. 13/204,218, filed Aug. 5, 2011, which claims priority to 61/344,510, filed Aug. 11, 2010 herein incorporated by reference) is directed to a vapor phase synthesis of diamond wherein a carbon atom (C) free of meta-stable radical impurities (methyl radical-$CH_3$., di-radical methylene-$CH_2$, tri-radical methyne-.CH:) is obtained from a hydrocarbon source and is reacted with a species produced by catalytic treatment of acetylene to yield diamond which precipitates from the vapor phase. While not meaning to be bound by theory, it is believed that the species derived by catalytic treatment of acetylene is tetrahedrane albeit transient and in low concentration. The skilled practitioner will understand that the product of this reaction is the diamond unit cell. A 2D representation of the 3D structure of the diamond unit cell is shown below.

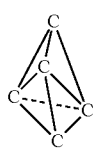

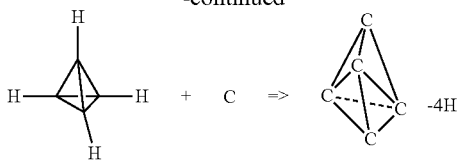

The present disclosure is directed to a combinatorial syntheses of the diamond unit cell. Formation of diamond by a synthesis of its unit cell as disclosed in this disclosure and my previous disclosure proceeds by a method altogether different from the typical methods of diamond formation. Synthesis of the diamond unit cell relies upon chemical modification of molecules having structures similar to that of the diamond unit cell. That is, they are tetrahedral or nearly tetrahedral, structurally, and have chemical reactivity which can be exploited to alter their structure to produce the diamond unit cell. Stable, isolable tetrahedranes are known. Their stability is an artifact of the four bulky substituents on the four carbon atoms comprising the molecules. However, it is this very steric bulk which make them unsuitable for use as reactants in a diamond unit cell forming reaction.

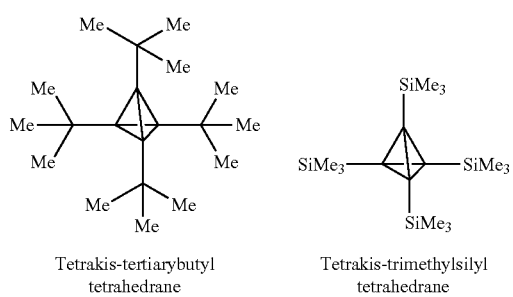

Tetrakis-tertiarybutyl tetrahedrane

Tetrakis-trimethylsilyl tetrahedrane

The diamond unit cell forming reaction of this disclosure proceeds by the reactions of a carbon atom free of meta-stable radical impurities, which is derived from a source hydrocarbon, with a second chemical species whose structure is closely related to tetrahedrane—a tetrahedranoidal structure. These tetrahedranoidal compounds can be understood as tetrahedranes having the 3,4 C—C bond replaced by an "insert" species.

DETAILED DESCRIPTION OF THE INVENTION

Examples of three known tetrahedranoidal compounds useful in this diamond unit cell forming reaction are show below (NON-IUPAC naming for simplicity).

Compound I—Benzvalene ($C_6H_6$) bp=77.558° C. (760 mm Hg) vapor pressure 106.123 mmHg at 25° C. The "inserted" species is —CH=CH— (ethylene).

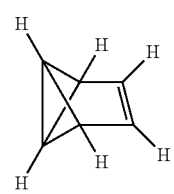

Compound II—2,3,4-methynyl-cyclobutanone ("Tetrahedranone", "Carbonyl tetrahedrane") ($C_5H_4O$) bp=~37° C. (some decomposition). The inserted species is CO (carbonyl, carbon monoxide).

Compound III—3,4,5-methynyl-dihydro-1,2-pyrazole (3,4-Diazabenvalene) ($C_4H_4N_2$); decomposes at about −60 degrees C. The inserted species is —N≡N— (dinitrogen).

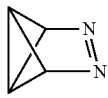

Compounds I and II are reasonably stable in the presence of oxygen, and these compounds have good stability ambient temperatures. Compound III decomposes at about −60° C. and is unstable in the presence of oxygen. Compounds I and II decompose rapidly and even violently if they contact sharp surfaces. Compounds I and II are sensitive to rapid heating, and the rate of heating must not exceed 5° C. per minute. Compounds I, II, and III are stored and used in inert atmospheres such as helium or argon which gases should be of research purity having no more than 10 ppm impurities which impurities are identifiable by gc/ms. Reactant manipulation within an anaerobic environment eliminates the formation $O_2$ induced radicals leading to impurities in the reactants which deleteriously effect the product of the diamond unit cell forming reactions in which they are used. Thus, a similar level of purities inert gases used in the diamond unit cell forming reactions is maintained. In one embodiment, purity is maintained using Schlenck (double manifold) techniques.

All three compounds react with a "clean" carbon atom to create the diamond unit cell along with concomitant ejection of 4 hydrogen atoms and the "inserted" species (HC≡CH, CO, $N_2$ for compounds I, II, and III, respectively).

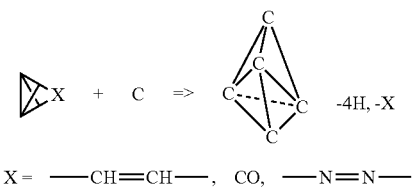

Spectral examination of diamond formed by this method using Raman or Infrared reflectance reveal only peaks associated with diamond. For example, C—H stretching bands at 2800-3000 $cm^{-1}$ typically observed for CVD diamond using methane gas is not observed. Graphitic impurities ($sp^2$ carbon) at 1580 $cm^{-1}$ which are frequently observed in CVD diamond are not observed. The sharp peak at 1328-1332 $cm^{-1}$ characteristic of diamond is observed.

Sources of atomic carbon may include saturated hydrocarbons such as methane, ethane, and cycloalkanes. In one embodiment, the carbon atom source is cubane.

Cubane ($C_8H_8$) MW=104.1491 mp=131° C. bp=133° C. vapor pressure=1.1 mm @25° C.

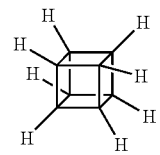

Cubane, which has a strain energy of 166 kcal/mol, decomposes cleanly in a high energy discharge environment discharge to carbon and hydrogen free of meta-stable radical impurities. In one embodiment, cubane is decomposed to hydrogen and carbon free of meta-stable radical impurities using a microwave discharge (1 kw @12 Ghz being adequate).

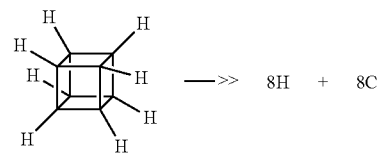

Other sources such as methane, ethane, and cycloalkanes do not decompose to atomic carbon free of meta-stable radical impurities but can be used as such sources in vapor phase diamond unit cell forming reactions if the complications of meta-stable radical impurities are overcome. Unsaturated hydrocarbons are not suitable as sources of carbon atoms free of meta-stable radical impurities. In another embodiment, sputtered carbon is used in a vapor phase reaction.

In one embodiment, the diamond unit cell forming reaction is conducted in the vapor phase. In another embodiment, the diamond unit cell forming reaction is conducted in the solid state.

In one embodiment of the solid state diamond unit cell forming reaction, a high degree of stoichiometric precision is employed to ensure a high degree of purity for the diamond product. An excess of cubane (the carbon atom source) introduces graphitic and amorphous carbon impurities into the diamond product. Excess tetrahedranoid can introduce C—H, graphitic, and even heteroatom impurities into the diamond product. The teatrahedranoid-to-cubane stoichiometry is 8:1. In one embodiment, the teatrahedranoid-to-cubane stoichiometry is precisely 8:1.

Thus, in one embodiment, stock solutions of cubane and tetrahedranoid compounds to be used are prepared and analyzed by liquid chromatography for concentration and for the presence of impurities. The impurities differ depending on the tetrahedranoid used. For example, the principal impurity in benzvalene is benzene which is notorious for imparting graphitic impurities into diamond. "Tetrahedranone" decomposes emitting carbon monoxide and rearranging to cyclobutadiene, seen spectroscopically as the dimer, dicyclobutadiene. "Tetrahedranone" can be separated from this impurity by slow and careful sublimation onto a −78° C. cold finger and recovered under inert atmosphere. The practitioner will understand that manipulative care must be exercised for these tetrahedranoidal compounds based upon their previously disclosed properties: benzvalene and "tetrahedranone" must be heated gently as previously described, and diazabenzvalene must be used below about −60° C., entirely under anaerobic conditions.

Commercially available liquid chromatography instruments are available for the quantitative and qualitative analyses required for stock solutions of reactants. Further, computer databases are available with such instruments for qualitative analyses of impurities (if any), and such instruments can provide the four place precision (and even higher) for quantitative analyses in these reactions. This allows optimum levels of precision for the diamond unit cell forming reactions to be obtained.

The purity of the diamond produced by the solid phase diamond unit cell forming reaction is an artifact of the purity of the reactants used. Thus, the process begins with the use of purified reactants. More specifically, the carbon atom source and the tetrahedronoidal compounds are purified. In one embodiment, the solutions of the individual reactants are prepared for analysis and standardization by liquid chromatography or by spectroscopic analysis. If the analysis verifies the requisite purity for the reaction, standardized stock solutions of precisely determined concentrations are prepared.

In one embodiment, the tetrahedranoidal compound (benzvalene, in this example) is adequately purified by placing it in a Schlenck (double manifold) vessel having a threaded wide mouth port, a septum port, and valved gas/vacuum arms operatively connected to the double manifold apparatus with a flow of inert gas (argon). The vessel is chilled to between −20° C. and −45° C. and then evacuated to remove benzene (if any). Inert sweep gas is admitted, and an aliquot of the sweep is sampled by gc/ms to determine the presence of impurities. When no impurities are detected, a solvent, such as dichloromethane (in on embodiment at least research grade) distilled under argon from $CaH_2$ is added to prepare a stock solution, an aliquot of which is analyzed by liquid chromatography for standardizing the concentration of the solution. Stock solutions of and "tetrahedranone" and of cubane are prepared similarly. Cubane may also be purified by sublimation in vacuum. Repeated sublimations of cubane are known to provide a product of very high purity with very small mass loss, overall.

In one embodiment, Schlenck (multiple manifolds) line solution transfer techniques are used to deliver reactants to their respective reaction receivers. The solutions are chilled and then freed of solvent under vacuum. Confirmation of complete solvent removal is done by gc/ms analysis of inert sweep gas. Alternatively, the tetrahedronoidal compounds I and II are purified using commercially available quantitative liquid chromatography apparatus.

Solutions of the carbon atom source (e.g. cubane) and the tetrahedronoidal compound are then combined and transferred to a reaction vessel. This solution is freed of solvent under reduced pressure and temperature. More specifically, the solutions are chilled and solvent is evaporated under reduced pressure slowly to prevent bumping. Once the solvent appears to be completely removed, a flow of inert gas is passed over the remaining solid residue and sampled by gc/ms to verify that no residual solvent remains. If any solvent remains, the process is repeated (pumping and sampling) until no residual solvent remains. Thereupon, the vessel is filled with inert gas, sealed, and transferred to a dry box for transfer of the reaction vessel to a high energy discharge cell. In one embodiment the high energy discharge cell is a microwave, an electrostatic discharge device, etc. The cell is sealed, removed from the dry box, connected to the double manifold apparatus, fitted with refrigerant lines to circulate refrigerant through the cold plate, and the exit port is connected to a gc/ms instrument as well as any additional ports as needed.

Upon adequate chilling of the solid reaction mixture within the reaction vessel placed upon the cold plate, the discharge is energized to initiate the diamond unit cell forming reaction while the effluent is monitored by gc/ms. In one embodiment, this process is conducted under vacuum. In another embodiment, this process is conducted in an inert gas. When no more ejection products are observed spectroscopically, energy to the discharge cell is discontinued and the reaction vessel is transferred to a spectrometer for product analysis.

In one embodiment, the reaction vessel containing the solid reaction is placed on a cold plate and chilled to about −20° C. to about −45° C. within a microwave discharge cell under an inert atmosphere. (At higher temperatures the tetrahedroidal compound(s) have sufficient vapor pressure to alter the precision of the stoichiometry).

In one embodiment, the cell is energized to effect the reaction which is over in about three to five seconds for a one mmol scale reaction. In one embodiment, the reaction is conducted under vacuum. In another embodiment, the reaction is monitored by gc/ms at the effluent port to determine when no more ejection products are detected.

In an embodiment wherein diazabenzvalene is the tetrahedranoidal reactant, the cold plate is kept at about −60° C. to −78° C. or lower.

EXAMPLES

A teflon lined glass receiver cylinder having a 2 cm diameter and 5 cm wall height is placed in a Schlenck vessel having a threaded wide mouth, gas/vacuum valve port, and septum port to which is attached an electronically controlled syringe pump. The vessel is sealed and evacuated followed by admission of argon and chilling in a dry ice/chlorobenzene bath (−45° C.). Via the syringe pump a first precisely standardized solution of 1 mmol of benzvalene in dry dichloromethane is delivered into the contained cylinder. A second precisely standardized solution of 0.125 mmol of cubane in dry dichloromethane is delivered to the contained cylinder to afford an 8:1 (molar) mixture of benzvalene and cubane in dichloromethane. The syringe tube (needle) is removed, and argon flow is stopped. Vacuum is applied slowly to minimize bumping, and the solvent is removed under complete vacuum (about 10 minutes). Argon is readmitted when visual observation of the cylinder indicates that it contains a dry (solvent free) solid. A portion of the argon flow is sampled by gc/ms to confirm complete removal of dichloromethane and absence of benzene. The cold bath is removed. The vessel is transferred to the load-lock of a glove box having an argon atmosphere, and the cylinder bearing the homogeneous mixture of solid cubane and benzvalene is removed from the Schlenck vessel and transferred to a microwave discharge cell. The cell is sealed, removed from the glove box, fitted with refrigerant lines to the cold plate on which the contained reaction cylinder is mounted, attached to the Schlenck line, attached to a gc/ms instrument at the cell effluent port, and refrigerant is circulated through the cold plate to maintain the reactant mixture at −45° C. Argon flow through the cell is initiated with commencement of gc/ms effluent monitoring. The cell is then energized to initiate to the diamond forming reaction. When gc/ms effluent monitoring indicates the effluent to be free of hydrogen or acetylene (about 5 seconds), energy to the discharge cell is ceased, refrigerant circulation is ceased, and the cell is opened to recover the reaction vessel. The glassy disc within the cell is brought to an FT-IR reflectance instrument which confirms diamond (1328-1332 $cm^{-1}$). No graphite, amorphous carbon, or C—H peaks are observed. The weight of the disk is 59.12 mg (98.4% of theoretical).

A vapor phase diamond unit cell forming reaction is performed as follows.

A teflon lined glass receiver cylinder having a 2 cm diameter and 5 cm wall height is placed in a Schlenck vessel having a threaded wide mouth, gas/vacuum valve port, and septum port to which is attached an electronically controlled syringe pump. The vessel is sealed and evacuated followed by admission of argon and chilling in a dry ice/chlorobenzene bath (−45° C.). Via the syringe pump a solution of 2 mmol of benzvalene in dichloromethane is delivered into the contained cylinder. A second teflon lined glass receiver cylinder having a 2 cm diameter and 5 cm wall height is placed in a a second Schlenck vessel having a threaded wide mouth, gas/vacuum valve port, and septum port to which is attached an electronically controlled syringe pump. The vessel is sealed and evacuated followed by admission of argon and chilling in a dry ice-chlorobenzene bath (−45° C.). Via the syringe pump a solution of 0.125 mmol of cubane in dichloromethane is delivered into the contained cylinder. The syringe lines (needles) are removed from both vessels. The flow of argon is ceased to both vessels. Vacuum is applied slowly to both vessels to mimimize bumping, and the solvent is removed under complete vacuum (about 10 minutes). Argon is readmitted to both vessels when visual observation of the cylinders indicates that both contain a dry (solvent free) solid. A portion of the argon flow is sampled by gc/ms to confirm complete removal of dichloromethane and absence of benzene. The cold bath is removed. The vessels are transferred to the load-lock of a glove box having an argon atmosphere, and the cylinder bearing cubane is transferred to the evaporator contained within the microwave discharge cell and sealed. The benzvalene containing cylinder is transferred to an evaporation cell having gas/vacuum valved fittings which are closed. Both cells are transferred to a CVD reactor, attached to gas/vacuum fittings, and configured for the diamond forming reaction by CVD.

A silicon foil disk deposition target is heated to 85° C. Then, using pre-programmed values, gas flow, heating of both evaporators, and application of energy to the microwave discharge are initiated with monitoring of the effluent by gc/ms. When no more reaction by products are detected by gc/ms, the reaction is terminated, and the substrate is allowed to come to ambient temperature, whereupon it is removed and weighed. Yield is 59.77 mg (99.5% of theoretical). FT-IR reflectance confirms the glassy film deposited upon the substrate to be diamond showing no graphite, amorphous carbon, or C—H peaks.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents.

I claim:

1. A combinatorial synthesis of a diamond unit cell, which comprises reacting a tetrahedranoidal molecule with a carbon atom, wherein the tetrahedranoidal molecule comprises benzvalene, 3,4-diazabenzvalene or 2,3,4-methynylcyclobutane.

2. The combinatorial synthesis of claim 1, wherein said carbon atom is obtained from a hydrocarbon source selected from the group consisting of alkanes, cycloalkanes and cubane.

3. The combinatorial synthesis of claim 2, wherein said carbon is obtained by exposing said hydrocarbon source to a high-energy discharge to produce said carbon uncomplicated by radical impurities.

4. The combinatorial synthesis of claim 1, wherein a diamond mass is formed by the assembly of a plurality of diamond unit cells.

5. The combinatorial synthesis of claim 1, conducted in vapor phase.

6. The combinatorial synthesis of claim 5, wherein said hydrocarbon source is cubane.

7. The combinatorial synthesis of claim 5, wherein a stiochiometric excess of tetrahedranoidal molecule with respect to carbon, uncomplicated by radical impurities, is used to ensure that all of said carbon atoms are consumed by the diamond unit cell forming reaction.

8. The combinatorial synthesis of claim 1, comprising forming a first flow of carbon atoms uncomplicated by radical impurities in an inert carrier gas, forming a second flow of tetrahedranoidal molecules in an inert carrier gas, and combining said first and second flows of reactants in said inert carrier gases proximal to a deposition substrate to produce the diamond unit cell which deposits from the vapor phase onto said deposition substrate to form a diamond mass.

9. The combinatorial synthesis of claim 8, wherein said tetrahedranoidal molecules are either benzvalene or 2,3,4-methynylcyclobutanone.

10. The combinatorial synthesis of claim 8, wherein the first flow of carbon atoms, uncomplicated by radical impurities, in an inert gas carrier is formed from a hydrocarbon source selected from the group consisting of alkanes, cycloalkanes and cubane, by volatilizing said hydrocarbon source into a flow of said inert gas to form a mixture, and passing the mixture so produced into a high-energy discharge cell where said vaporous mixture is subjected to a high-energy discharge to produce said flow of carbon atoms uncomplicated by radical impurities in an inert carrier gas.

11. The combinatorial synthesis of claim 1, wherein diamond mass is produced having no graphitic impurity detected spectrographically.

12. A combinatorial synthesis of a diamond unit cell, which comprises reacting a tetrahedranoidal molecule with a carbon atom in a solid state.

13. The combinatorial synthesis of claim 12, wherein a homogenous mixture of tetrahedranoidal molecules and cubane in a molar ratio of about 8 to 1 is placed into a high-energy discharge cell and subjected to a high-energy discharge for a time sufficient to ensure that the diamond unit cell forming reaction is complete.

14. The combinatorial synthesis of claim 13, wherein the ratio is 8 to 1.

15. The combinatorial synthesis of claim 13, wherein the tetrahedranoidal molecule is selected from the group consisting of benzvalene; 3,4-diazabenzvalene, and 2,3,4-methynylcyclobutanone.

16. The combinatorial synthesis of claim 13, wherein the high-energy discharge is microwaves.

17. The combinatorial synthesis of claim 12, wherein diamond mass is produced having no graphitic impurity detected spectrographically.

* * * * *

UNITED STATES PATENT AND TRADEMARK OFFICE
CERTIFICATE OF CORRECTION

Page 1 of 1

PATENT NO. : 9,061,917 B2
APPLICATION NO. : 14/120508
DATED : June 23, 2015
INVENTOR(S) : Daniel Hodes It is certified that error appears in the above-identified patent and that said Letters Patent is hereby corrected as shown below:

In the specification

At column 3, line 6, delete:

"3,4,5-methynyl-dihydro-1,2-pyrazole"

and insert therefor:

-- -3,4,5-methynylpyrazoline- --.

Signed and Sealed this
Nineteenth Day of July, 2016

Michelle K. Lee
*Director of the United States Patent and Trademark Office*